United States Patent [19] [11] 4,037,114
Stewart et al. [45] July 19, 1977

[54] TRI-STATE LOGIC CIRCUIT

[75] Inventors: Roger Green Stewart, Neshanic Station; Marceano Seixo de Melo Paulino, Bound Brook, both of N.J.

[73] Assignee: RCA Corporation, New York, N.Y.

[21] Appl. No.: 625,038

[22] Filed: Oct. 23, 1975

[51] Int. Cl.$^2$ ...................... H03K 19/08; H03K 19/38
[52] U.S. Cl. ...................................... 307/205; 307/209
[58] Field of Search ................ 307/205, 209, 215, 251

[56] References Cited

U.S. PATENT DOCUMENTS

| | | | |
|---|---|---|---|
| 3,356,858 | 12/1967 | Wanlass | 307/205 |
| 3,651,342 | 3/1972 | Dingwall | 307/215 X |
| 3,906,255 | 9/1975 | Mensch, Jr. | 307/209 X |
| 3,912,947 | 10/1975 | Buchanan | 307/209 X |

OTHER PUBLICATIONS

Kraft et al., "Tristate Driver Utilizing Bipolar-CMOS Technology;" IBM Tech. Discl. Bull.; vol. 16, No. 8, pp. 2677-2678; 1/1974.

"Tri-State Logic;" 5/1971, published by National Semiconductor Corp., from Digital Integrated Circuits Manual; pp. XII-XIII.

*Primary Examiner*—John S. Heyman
*Assistant Examiner*—Larry N. Anagnos
*Attorney, Agent, or Firm*—H. Christoffersen; Henry I. Schanzer

[57] ABSTRACT

The conduction paths of two output complementary transistors are connected in series between first and second points of potential with the junction of the two transistors being connected to an output terminal. A control circuit responsive to control and data signals is connected to the two output transistors. In response to one condition of the control signal, the two output transistors are turned off by having connected between the control electrode (gate) and one end of the conduction path (source) of each one of them the conduction path of a different control transistor operated in a common switching (source) mode. In response to another condition of the control signal, the same logic signal is applied to the control electrodes of the two output transistors for turning one of them on by means of at least one of the control transistors operating in the common switching mode, to produce an output indicative of the data signal.

5 Claims, 1 Drawing Figure

+$V_{DD}$ 14 P3 P2 2 P1 16 18 P4 N4 N2 10 4 N1 N3 12

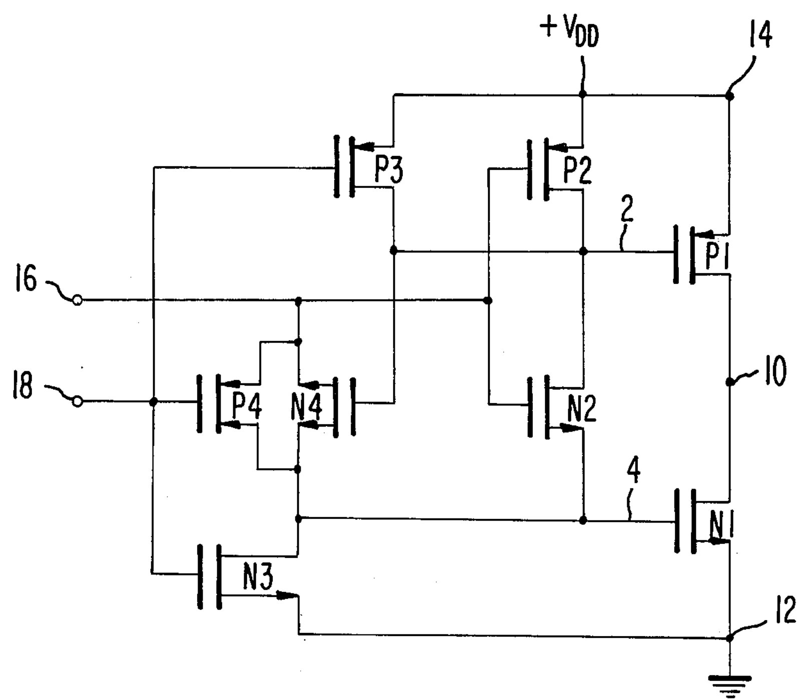
+$V_{DD}$
14
P3
P2
2
P1
16
18
P4
N4
N2
10
4
N1
N3
12

TRI-STATE LOGIC CIRCUIT

This invention relates to logic circuits and particularly to tri-state logic circuits employing complementary transistors.

A tri-state logic circuit is a logic circuit having an output terminal which can be driven to any of three states. Current can be supplied into the output terminal in a first state, current can be drawn from the output terminal in a second state, or the output can assume an isolated (floating) condition in a third state.

An approach for obtaining tri-state operation is to drive the output terminal with a pair of complementary output transistors serially connected between a power supply point and ground, and to provide a logic circuit for separately controlling the gates of the complementary transistor pair. In response to one condition of a control signal, the logic circuit applies the same polarity signals to the control electrodes of the output transistors, clamping the output terminal either to the power supply point or to ground depending upon the sense of the control signal. In response to another condition of the control signal, the logic circuit supplies suitable complementary signals to the complementary transistors, to bias both of them off concurrently and thereby to isolate the output terminal. This approach offers low impedance symmetrical drive with low shunt capacity to the output and provides high speed operation.

A known logic circuit for performing the tri-state logic function includes six insulated-gate field-effect transistors (IGFETs) for controlling two output complementary IGFETs. A problem with the known circuit is that, for some operating conditions, one of the two output transistors is attempted to be turned off by connecting between its gate and source the conduction path (drain-to-source) of a control transistor operated in the source-follower mode. In the source-follower mode the minimum voltage across the conduction path of the control transistor is equal to the threshold voltage ($V_T$) of the transistor. $V_T$ is defined as the minimum potential that must be applied between the gate and source of a transistor to turn it on. In the source-follower mode a transistor does not function as a good switch since there exists an offset across its conduction path. This offset is hard to control and varies with temperature. Thus, if the $V_T$ of the output transistor is less than the $V_T$ of the control transistor, the latter cannot turn off the former. An analogous situation exists for bipolar transistors operated in the emitter follower mode. In this mode the minimum $V_{BE}$ offset which exists between the base and emitter appears across the conduction path. The term "voltage follower" is used hereinfter to include the source follower or the emitter-follower mode.

In this application, the term "common switching mode" is intended to include the common-source mode, which refers to operation of IGFETs, and the common-emitter mode which refers to operation of bipolar transistors. In the common switching mode, the conduction path of a transistor may be switched to an extremely low impedance with little, if any, offset across its conduction path, thereby providing good clamping action.

In circuits embodying the invention the two output transistors of a tri-state circuit are controlled by a transistorized control circuit. Each one of the output transistors, when being turned off, is turned off by a control transistor operated in the common switching mode.

The sole FIGURE of the drawing is a schematic diagram of a tri-state circuit embodying the invention.

In the sole FIGURE insulated-gate field-effect transistors (IGFETs) of the enhancement type are used to illustrate the invention. However, it is to be understood that other known types of transistors, whether field-effect or bipolar, may be used to practice the invention. Characteristics of IGFETs pertinent to the invention and for the purpose of aiding the understanding of the circuits are present below:

1. The transistors used have first and second electrodes, referred to as the source and drain, defining the ends of a conduction path, and a control electrode (gate) whose applied potential determines the conductivity of the conduction path. For a P-type IGFET, the source electrode is defined as that electrode of the first and second electrodes having the higher potential applied thereto. For an N-type IGFET, the source electrode is defined as that electrode of the first and second electrodes having the lower potential applied thereto.

2. The devices used are bidirectional in the sense that when an enabling signal is applied to the control electrode, current can flow in either direction in the conduction path defined by the first and second electrodes.

3. For conduction to occur, the applied gate-to-source potential ($V_{GS}$) must be in a direction to enhance conduction and must be greater in amplitude than a minimum value which is defined as the threshold voltage ($V_T$). Thus, where the applied $V_{GS}$ is in a direction to enhance conduction but is lower in amplitude than $V_T$, the transistor remains cut off and there is substantially no current flow in the conduction channel.

In the embodiment of the invention shown in the FIGURE, the transistoers of P-conductivity type are identified by the letter P followed by a reference numeral and the transistors of N-conductivity type are identified by the letter N followed by a reference numeral. The conduction path of a first transistor N1 is connected between an output terminal 10 and ground terminal 12. The conduction path of a second transistor P1 is connected between terminal 10 and terminal 14 to which is applied a positive potential of $V_{DD}$ volts. The conduction paths of third and fourth transistors P2 and P3 are connected in parallel between terminal 14 and node 2 which is connected to the gate of transistor P1. The conduction paths of fifth and sixth transistors N2 and N3 are connected in series between node 2 and ground. The source of N2 and the drain of N3 are connected to node 4 which is connected to the gate of transistor N1.

The gates of transistors P2 and N2 are connected to a terminal 16 to which is applied an Enable (E) signal. The gates of transistors P3 and N3 are connected to a terminal 18 to which is applied the data input (D) signal.

A seventh transistor N4 and an eighth transistor P4 have their conduction paths connected in parallel between node 4 and terminal 16. The gate of transistor N4 is connected to node 2 and the gate of transistor P4 is connected to terminal 18.

For the condition when the E signal applied to terminal 16 is high ($V_{DD}$) the circuit functions to produce an output signal at terminal 10 which is in phase with the data input signal. For the condition when the E signal is low (ground) transistors P1 and N1 are cut off and the circuit is characterized by extremely high, floating, output impedance.

When E is high, transistor P2 is turned off and transistor N2 is turned on, causing nodes 2 and 4 to be coupled through the low on impedance of transistor N2.

If D is also high, transistors P3 and P4 are turned off and transistor N3 is turned on. Node 2 is clamped to ground through the series connected conduction paths of transistors N2 and N3. Node 4 is clamped to ground through the conduction path of transistor N3. Transistor N4 is turned off since its gate is connected to then-grounded node 2. With nodes 2 and 4 at ground, transistor P1 is turned on and clamps the output to $V_{DD}$ volts; transistor N1 is positively turned off since its gate is clamped to ground by transistor N3.

Consider now E high and D low. Transistor P2 is off and transistor N2 is on. Transistor P3 is turned on and conducts in the common source mode, clamping node 2 to $V_{DD}$ volts. Transistor N3 is off. Transistor P4 is turned on and conducts in the common source mode since D low is applied to its gate (terminal 18), $V_{DD}$ is applied to its source (terminal 16) and its drain is at node 4. Therefore, node 4 is clamped to the high level at terminal 16 via transistor P4 conducting in the common source mode. With nodes 2 and 4 at $V_{DD}$ volts, transistor P1 is turned off and transistor N1 is turned on, clamping output terminal 10 to ground. When node 4 is being charged to the high level, transistor N2 conducts in the source follower mode, charging node 4 to the potential at node 2 through its conduction path and transistor N4 is turned on and also conducts in the source follower mode since +V volts is applied to its gate (node 2), +V volts is applied to its drain (terminal 16) and its source is at node 4. The multiple paths charging node 4 ensure fast operation.

When E is low, transistor P2 is turned on and it conducts in the common source mode, clamping node 2 to $V_{DD}$. Transistor N2 is turned off. Transistor N4, with $+V_{DD}$ applied to its gate (node 2), its drain connected to node 4, and its source connected to terminal 16, conducts in the common source mode and clamps node 4 to E low at terminal 16.

For the condition when D is high, transistors P3 and P4 are turned off and transistor N3 is turned on. Transistor N3 conducts in the common source mode and clamps node 4 to ground potential. Therefore, for the condition E low and D high, node 4 is clamped to ground potential by transistors N3 and N4 operating in the common source mode. The gate of transistor P1 is clamped to $V_{DD}$ volts by transistor P2 operating in the common source mode. Transistors N1 and P1 are, therefore, turned off, each having at least one common source operated control transistor clamping its gate to its source.

With E low, transistor P2 and N2 remain on and off, respectively. Transistor N4 conducts in the common source mode and clamps node 4 to E low at terminal 16. When D is low, transistor P3 is turned on and conducts in the common source mode, clamping node 2 to $V_{DD}$ volts. Transistor P4 is turned on and conducts in the source-follower mode, helping to discharge node 4 to the E low, present at terminal 16. Transistor N3 is turned off. Therefore, for the condition E low and D low, transistors P2 and P3 clamp node 2 to $V_{DD}$ volts and transistor N4, operating in the common source mode, clamps node 4 to the low level at terminal 16, ensuring that a true low level is established at node 4. With node 2 high transistor P1 is cut off and with node 4 low transistor N1 is cut off. Therefore, for this input signal condition the output terminal 10 is floating. In the quiescent state there is no low impedance current carrying path between $V_{DD}$ and ground for any of the output states high, low, or floating. This results in an extremely low power dissipation circuit.

Transistors P2 and P3, N2 and N3 form a NAND gate-like structure with one output (the NAND) being taken at node 2 and a second output being taken at the junction (node 4) of transistors N2 and N3. Transistors P4 and N4 function as a transmission gate with one control signal to the transmission gate being the NAND signal produced at node 2, the second control signal to the transmission gate being the data input signal; and the input to the transmission gate being the Enable signal.

In the circuit described, each transistor could be replaced by its complement and the power supplies inverted. For this complementary structure, the transistors substituted for transistors P2, P3, N2 and N4 would form a NOR gate-like structure; while the transistors substituted for P4 and N4 would still form a transmission gate. For this complementary structure the output would float when the Enable signal is high and would pass the D signal to the output when the Enable signal is low.

What is claimed is:

1. In combination:

first and second points for the application therebetween of an operating potential;

first and second transistors of first and second conductivity type, respectively, each transistor having a conduction path and a control electrode; means connecting their conduction paths in series between said first and second points;

an output terminal connection between the conduction paths of said first and second transistors;

a data input terminal, and a control input terminal;

third and fourth transistors of said first conductivity type having their conduction paths connected in parallel between the control electrode of said first transistor and said first point;

fifth and sixth transistors of said second conductivity type having their conduction paths connected in series between the control electrode of said first transistor and said second point; means connecting the control electrode of said second transistor to the junction of the conduction paths of said fifth and sixth transistors;

means connecting the control electrodes of said third and fifth transistors to said control input terminal;

means connecting the control electrodes of said fourth and sixth transistors to said data input terminal; and a seventh transistor of said second conductivity type having its conduction path connected between the control electrode of said second transistor and said control input terminal; and means connecting the control electrode of said seventh transistor to the control electrode of said first transistor.

2. The combination as claimed in claim 1 further including an eighth transistor of said first conductivity type having its conduction path connected in parallel with the conduction path of said seventh transistor; and means connecting the control electrode of said eighth transistor to said data input terminal.

3. The combination as claimed in claim 2 wherein said transistors are insulated-gate field-effect transistors; and wherein said first conductivity type is one of N and P channel conductivity type and said second conductivity type is the other one of said N and P channel conductivity type.

4. The combination as claimed in claim 2 wherein said third, fourth, fifth, and sixth transistors form a complementary NAND gate, and wherein said seventh and eighth transistors form a complementary transistor transmission gate.

5. The combination as claimed in claim 4 wherein binary signals are applied to said input terminals.

* * * * *